(12) United States Patent
Fukagawa et al.

(10) Patent No.: US 8,746,878 B2
(45) Date of Patent: Jun. 10, 2014

(54) OPTICAL MEMBER, PLASTIC LENS FOR EYEGLASSES, AND METHOD FOR MANUFACTURING THE SAME

(75) Inventors: Tsuyoshi Fukagawa, Okazaki (JP); Hirotoshi Takahashi, Okazaki (JP); Kazuyoshi Umemura, Okazaki (JP)

(73) Assignee: Tokai Optical Co., Ltd., Okazaki-Shi (JP)

( * ) Notice: Subject to any disclaimer, the term of this patent is extended or adjusted under 35 U.S.C. 154(b) by 270 days.

(21) Appl. No.: 13/240,067

(22) Filed: Sep. 22, 2011

(65) Prior Publication Data

US 2012/0062833 A1 Mar. 15, 2012

Related U.S. Application Data

(63) Continuation of application No. PCT/JP2010/054297, filed on Mar. 15, 2010.

(30) Foreign Application Priority Data

Apr. 1, 2009 (JP) .................................. 2009-089456

(51) Int. Cl.
*G02B 1/10* (2006.01)

(52) U.S. Cl.
USPC .................. 351/159.01; 351/159.57; 359/581

(58) Field of Classification Search
USPC ................. 351/159.49, 159.57, 178; 359/581
See application file for complete search history.

(56) References Cited

U.S. PATENT DOCUMENTS

| | | | |
|---|---|---|---|
| 5,719,705 A * | 2/1998 | Machol | 359/581 |
| 5,827,580 A | 10/1998 | Anders et al. | |
| 6,399,228 B1 * | 6/2002 | Simpson | 428/699 |
| 7,736,742 B2 | 6/2010 | Thomas et al. | |
| 2002/0102412 A1 | 8/2002 | Anthes et al. | |
| 2003/0038028 A1 | 2/2003 | Schultheis et al. | |
| 2003/0173545 A1* | 9/2003 | Hino et al. | 252/500 |
| 2004/0047047 A1* | 3/2004 | Yamaguchi et al. | 359/666 |
| 2006/0006382 A1 | 1/2006 | Moser | |
| 2007/0178315 A1 | 8/2007 | Thomas et al. | |
| 2007/0259132 A1 | 11/2007 | Moser | |
| 2011/0151167 A1* | 6/2011 | Okumura et al. | 428/40.6 |

FOREIGN PATENT DOCUMENTS

| | | |
|---|---|---|
| EP | 0 762 151 A2 | 3/1997 |
| EP | 1 284 302 A1 | 2/2003 |
| JP | 09-090102 A1 | 4/1997 |

(Continued)

OTHER PUBLICATIONS

European Search Report, European Patent Application No. 10 758 398.1, dated Apr. 5, 2013 (6 pages).

(Continued)

*Primary Examiner* — Evelyn A Lester
*Assistant Examiner* — William Alexander
(74) *Attorney, Agent, or Firm* — Burr & Brown, PLLC

(57) ABSTRACT

An optical member includes a substoichiometric titanium oxide film formed by depositing substoichiometric titanium oxides in a vacuum chamber into which an oxygen gas for adjusting a vacuum is introduced. In the optical member, the film forming pressure p (Pa) in the vacuum chamber and the optical film thickness (a refractive index of 2.50, a wavelength of 500 nm) of the substoichiometric titanium oxide film have relations of (1) $p \geq 0.005$, (2) optical film thickness $\leq 0.500\lambda$, and (3) optical film thickness $\geq (0.001 \exp(905.73p) - 0.050)\lambda$ where exp is an exponential function with e as the base of the natural logarithm.

12 Claims, 23 Drawing Sheets

| SAMPLE | | 1-1 | 1-2 | 2-1 | 2-2 | 3-1 | 3-2 | 4-1 | 4-2 | 5-1 | 5-2 | 6-1 | 7-2 | 8-2 |
|---|---|---|---|---|---|---|---|---|---|---|---|---|---|---|
| FILM FORMING PRESSURE [Pa] | | 9.3E-03 | | 7.5E-03 | | 5.0E-03 | | 2.0E-03 | | 1.0E-03 | | 6.0E-03 | 4.0E-03 | 3.0E-03 |
| OPTICAL FILM THICKNESS ($\lambda$= 500 nm) | | 0.500λ | 0.050λ | 0.500λ | 0.050λ | 0.500λ | 0.050λ | 0.500λ | 0.050λ | 0.500λ | 0.050λ | 0.500λ | 0.050λ | 0.050λ |
| APPEARANCE-COLOR | | ○ | ○ | ○ | ○ | ○ | ○ | × | ○ | × | ○ | ○ | ○ | ○ |
| ABSORPTANCE [%] at 550 nm | | 0.4 | 0.2 | 0.4 | 0.2 | 5.3 | -0.1 | 26.9 | 1.2 | 27.9 | 1.4 | 3.0 | 0.3 | 0.8 |
| MEASUREMENT OF CHARGED ELECTROSTATIC POTENTIAL [kV] | INITIAL STATE | 0.00 | 0.00 | 0.00 | 0.00 | 0.00 | 0.00 | 0.00 | 0.00 | 0.00 | 0.00 | 0.00 | 0.00 | 0.00 |
| | IMMEDIATELY AFTER RUB FOR 10 SECONDS | 3.20 | 7.80 | 2.50 | 7.20 | 0.00 | 5.50 | 0.00 | 0.01 | 0.00 | 0.08 | 0.10 | 7.00 | 5.00 |
| | AFTER 1 MINUTE | 2.40 | 6.10 | 1.40 | 6.80 | 0.00 | 5.40 | 0.00 | 0.00 | 0.00 | 0.05 | 0.08 | 6.80 | 3.30 |
| | AFTER 2 MINUTES | 2.00 | 5.80 | 1.10 | 6.40 | 0.00 | 5.20 | 0.00 | 0.00 | 0.00 | 0.05 | 0.07 | 6.40 | 2.30 |
| | AFTER 3 MINUTES | 1.70 | 5.50 | 0.95 | 6.40 | 0.00 | 5.20 | 0.00 | 0.00 | 0.00 | 0.05 | 0.07 | 6.00 | 2.00 |
| STEEL WOOL ADHESION | | × | × | × | × | ○ | × | ○ | ○ | ○ | ○ | ○ | × | × |
| ANTI-STATIC PROPERTIES | | × | × | × | × | ○ | × | ○ | ○ | ○ | ○ | ○ | × | × |

(56) References Cited

FOREIGN PATENT DOCUMENTS

| | | |
|---|---|---|
| JP | 09-105801 A1 | 4/1997 |
| JP | 2002-226967 A1 | 8/2002 |
| JP | 2005-234188 A1 | 9/2005 |
| JP | 2005-338366 A1 | 12/2005 |
| JP | 2007-520738 A1 | 7/2007 |
| WO | 96/41215 A1 | 12/1996 |
| WO | 2004/029323 A1 | 4/2004 |

OTHER PUBLICATIONS

Extended European Search Report dated Aug. 7, 2012.
Japanese Office Action dated Dec. 11, 2012.

\* cited by examiner

FIG.1

| SAMPLE | | 1-1 | 1-2 | 2-1 | 2-2 | 3-1 | 3-2 | 4-1 | 4-2 | 5-1 | 5-2 | 6-1 | 7-2 | 8-2 |
|---|---|---|---|---|---|---|---|---|---|---|---|---|---|---|
| FILM FORMING PRESSURE [Pa] | | 9.3E-03 | | 7.5E-03 | | 5.0E-03 | | 2.0E-03 | | 1.0E-03 | | 6.0E-03 | 4.0E-03 | 3.0E-03 |
| OPTICAL FILM THICKNESS ($\lambda$= 500 nm) | | 0.500$\lambda$ | 0.050$\lambda$ | 0.500$\lambda$ | 0.050$\lambda$ | 0.500$\lambda$ | 0.050$\lambda$ | 0.500$\lambda$ | 0.050$\lambda$ | 0.500$\lambda$ | 0.050$\lambda$ | 0.500$\lambda$ | 0.050$\lambda$ | 0.050$\lambda$ |
| APPEARANCE COLOR | | ○ | ○ | ○ | ○ | ○ | ○ | × | ○ | × | ○ | ○ | ○ | ○ |
| ABSORPTANCE [%] at 550 nm | | 0.4 | 0.2 | 0.4 | 0.2 | 5.3 | -0.1 | 26.9 | 1.2 | 27.9 | 1.4 | 3.0 | 0.3 | 0.8 |
| MEASUREMENT OF CHARGED ELECTROSTATIC POTENTIAL [kV] | INITIAL STATE | 0.00 | 0.00 | 0.00 | 0.00 | 0.00 | 0.00 | 0.00 | 0.00 | 0.00 | 0.00 | 0.00 | 0.00 | 0.00 |
| | IMMEDIATELY AFTER RUB FOR 10 SECONDS | 3.20 | 7.80 | 2.50 | 7.20 | 0.00 | 5.50 | 0.00 | 0.01 | 0.00 | 0.08 | 0.10 | 7.00 | 5.00 |
| | AFTER 1 MINUTE | 2.40 | 6.10 | 1.40 | 6.80 | 0.00 | 5.40 | 0.00 | 0.00 | 0.00 | 0.05 | 0.08 | 6.80 | 3.30 |
| | AFTER 2 MINUTES | 2.00 | 5.80 | 1.10 | 6.40 | 0.00 | 5.20 | 0.00 | 0.00 | 0.00 | 0.05 | 0.07 | 6.40 | 2.30 |
| | AFTER 3 MINUTES | 1.70 | 5.50 | 0.95 | 6.40 | 0.00 | 5.20 | 0.00 | 0.00 | 0.00 | 0.05 | 0.07 | 6.00 | 2.00 |
| STEEL WOOL ADHESION | | × | × | × | × | ○ | × | ○ | ○ | ○ | ○ | ○ | × | × |
| ANTI-STATIC PROPERTIES | | × | × | × | × | ○ | × | ○ | ○ | ○ | ○ | ○ | × | × |

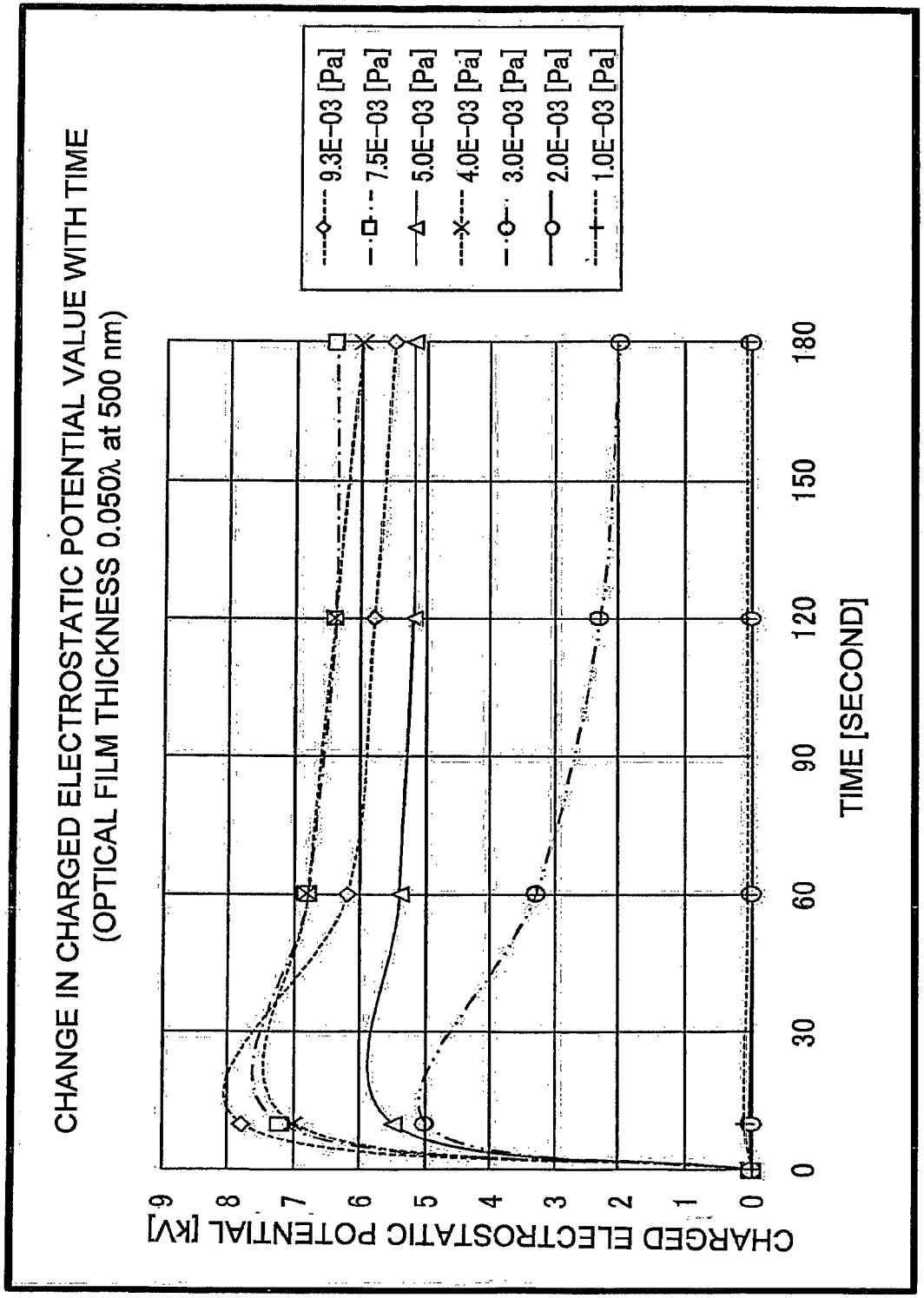

FIG. 4

| FILM FORMING PRESSURE [Pa] | 7.5E-03 | | 6.7E-03 | | 6.0E-03 | | 5.5E-03 | |
|---|---|---|---|---|---|---|---|---|
| | ANTI-STATIC PROPERTIES | COLORING | ANTI-STATIC PROPERTIES | COLORING | ANTI-STATIC PROPERTIES | COLORING | ANTI-STATIC PROPERTIES | COLORING |
| 0.500λ | × | ○ | ○ | ○ | - | ○ | - | - |
| 0.450λ | - | - | ○ | ○ | - | ○ | - | - |
| 0.400λ | - | - | × | ○ | ○ | ○ | - | - |
| 0.350λ | - | - | × | ○ | ○ | ○ | - | - |
| 0.300λ | - | - | × | ○ | - | ○ | - | - |
| 0.250λ | - | - | × | ○ | ○ | - | - | - |
| 0.200λ | - | - | × | ○ | ○ | ○ | ○ | ○ |
| 0.150λ | - | - | × | ○ | × | ○ | ○ | ○ |
| 0.100λ | - | - | × | ○ | × | - | - | - |
| 0.050λ | × | ○ | × | ○ | - | - | - | - |

OPTICAL FILM THICKNESS (λ = 500 nm)

| FILM FORMING PRESSURE [Pa] | 5.0E-03 | | 4.0E-03 | | 3.0E-03 | | 2.0E-03 | |
|---|---|---|---|---|---|---|---|---|
| | ANTI-STATIC PROPERTIES | COLORING | ANTI-STATIC PROPERTIES | COLORING | ANTI-STATIC PROPERTIES | COLORING | ANTI-STATIC PROPERTIES | COLORING |
| 0.500λ | ○ | ○ | - | - | - | - | ○ | × |
| 0.450λ | - | - | - | - | - | - | - | - |
| 0.400λ | ○ | ○ | - | - | - | - | - | - |
| 0.350λ | - | ○ | - | - | - | - | - | - |
| 0.300λ | ○ | ○ | - | - | - | - | - | - |
| 0.250λ | ○ | ○ | - | - | - | - | - | - |
| 0.200λ | ○ | ○ | - | - | - | - | - | - |
| 0.150λ | - | - | - | - | × | - | - | - |
| 0.100λ | - | - | - | - | - | - | - | - |
| 0.050λ | × | ○ | - | ○ | - | ○ | ○ | ○ |

OPTICAL FILM THICKNESS (λ = 500 nm)

FIG.5A

| FILM FORMING PRESSURE [Pa] | | 6.7E-03 | | | | | | | | | |
|---|---|---|---|---|---|---|---|---|---|---|---|
| OPTICAL FILM THICKNESS (λ = 500 nm) | | 0.500λ | 0.450λ | 0.400λ | 0.350λ | 0.300λ | 0.250λ | 0.200λ | 0.150λ | 0.100λ | 0.050λ |
| MEASUREMENT OF CHARGED ELECTROSTATIC POTENTIAL [kV] | INITIAL STATE | 0.00 | 0.00 | 0.00 | 0.00 | 0.00 | 0.00 | 0.00 | 0.00 | 0.00 | 0.00 |
| | IMMEDIATELY AFTER RUB FOR 10 SECONDS | 0.30 | 0.29 | 0.57 | 0.60 | 0.80 | 1.13 | 0.98 | 3.80 | 5.80 | 7.10 |
| | AFTER 1 MINUTE | 0.17 | 0.14 | 0.24 | 0.28 | 0.58 | 0.76 | 0.74 | 3.80 | 5.00 | 5.80 |
| | AFTER 2 MINUTES | 0.13 | 0.11 | 0.16 | 0.24 | 0.48 | 0.60 | 0.66 | 3.80 | 4.80 | 5.80 |
| | AFTER 3 MINUTES | 0.08 | 0.10 | 0.05 | 0.20 | 0.42 | 0.38 | 0.48 | 3.80 | 4.50 | 5.20 |
| STEEL WOOL ADHESION | | ○ | ○ | ○ OR △ | △ | △ | △ | △ | × | × | × |
| ANTI-STATIC PROPERTIES | | ○ | ○ | ○ OR △ | △ | △ | △ | △ | × | × | × |

FIG.5B

| FILM FORMING PRESSURE [Pa] | | 6.0E-03 | | | | | | | | | |
|---|---|---|---|---|---|---|---|---|---|---|---|
| OPTICAL FILM THICKNESS (λ = 500 nm) | | 0.500λ | 0.450λ | 0.400λ | 0.350λ | 0.300λ | 0.250λ | 0.200λ | 0.150λ | 0.100λ | 0.050λ |
| MEASUREMENT OF CHARGED ELECTROSTATIC POTENTIAL [kV] | INITIAL STATE | 0.00 | 0.00 | 0.00 | - | 0.00 | - | 0.00 | 0.00 | 0.00 | - |
| | IMMEDIATELY AFTER RUB FOR 10 SECONDS | 0.10 | 0.00 | 0.00 | - | 0.04 | - | 0.02 | 4.20 | 6.50 | - |
| | AFTER 1 MINUTE | 0.08 | 0.00 | 0.00 | - | 0.01 | - | 0.00 | 2.20 | 5.70 | - |
| | AFTER 2 MINUTES | 0.07 | 0.00 | 0.00 | - | 0.00 | - | 0.00 | 1.80 | 4.90 | - |
| | AFTER 3 MINUTES | 0.07 | 0.00 | 0.00 | - | 0.00 | - | 0.00 | 0.70 | 4.80 | - |
| STEEL WOOL ADHESION | | ○ | ○ | ○ | - | ○ | - | ○ | × | × | - |
| ANTI-STATIC PROPERTIES | | ○ | ○ | ○ | - | ○ | - | ○ | × | × | - |

FIG.5C

| FILM FORMING PRESSURE [Pa] | | 5.0E-03 | | | | | | | | | |
|---|---|---|---|---|---|---|---|---|---|---|---|
| OPTICAL FILM THICKNESS (λ = 500 nm) | | 0.500λ | 0.450λ | 0.400λ | 0.350λ | 0.300λ | 0.250λ | 0.200λ | 0.150λ | 0.100λ | 0.050λ |
| MEASUREMENT OF CHARGED ELECTROSTATIC POTENTIAL [kV] | INITIAL STATE | 0.00 | 0.00 | 0.00 | - | 0.00 | - | 0.00 | 0.00 | 0.00 | 0.00 |
| | IMMEDIATELY AFTER RUB FOR 10 SECONDS | 0.00 | 0.00 | 0.00 | - | 0.04 | - | 0.01 | 0.02 | 0.44 | 5.50 |
| | AFTER 1 MINUTE | 0.00 | 0.00 | 0.00 | - | 0.04 | - | 0.00 | 0.02 | 0.39 | 5.40 |
| | AFTER 2 MINUTES | 0.00 | 0.00 | 0.00 | - | 0.04 | - | 0.00 | 0.02 | 0.36 | 5.20 |
| | AFTER 3 MINUTES | 0.00 | 0.00 | 0.00 | - | 0.04 | - | 0.00 | 0.02 | 0.33 | 5.20 |
| STEEL WOOL ADHESION | | ○ | ○ | ○ | - | ○ | - | ○ | ○ | ○ | × |
| ANTI-STATIC PROPERTIES | | ○ | ○ | ○ | - | ○ | - | ○ | ○ | ○ | × |

FIG.5D

| FILM FORMING PRESSURE [Pa] | | 5.5E-03 | | | | | | | | | |
|---|---|---|---|---|---|---|---|---|---|---|---|
| OPTICAL FILM THICKNESS (λ = 500 nm) | | 0.500λ | 0.450λ | 0.400λ | 0.350λ | 0.300λ | 0.250λ | 0.200λ | 0.150λ | 0.100λ | 0.050λ |
| MEASUREMENT OF CHARGED ELECTROSTATIC POTENTIAL [kV] | INITIAL STATE | - | - | - | - | - | - | 0.00 | 0.00 | - | - |
| | IMMEDIATELY AFTER RUB FOR 10 SECONDS | - | - | - | - | - | - | 0.03 | 0.12 | - | - |
| | AFTER 1 MINUTE | - | - | - | - | - | - | 0.03 | 0.09 | - | - |
| | AFTER 2 MINUTES | - | - | - | - | - | - | 0.03 | 0.08 | - | - |
| | AFTER 3 MINUTES | - | - | - | - | - | - | 0.03 | 0.08 | - | - |
| STEEL WOOL ADHESION | | - | - | - | - | - | - | ○ | ○ | - | - |
| ANTI-STATIC PROPERTIES | | - | - | - | - | - | - | ○ | ○ | - | - |

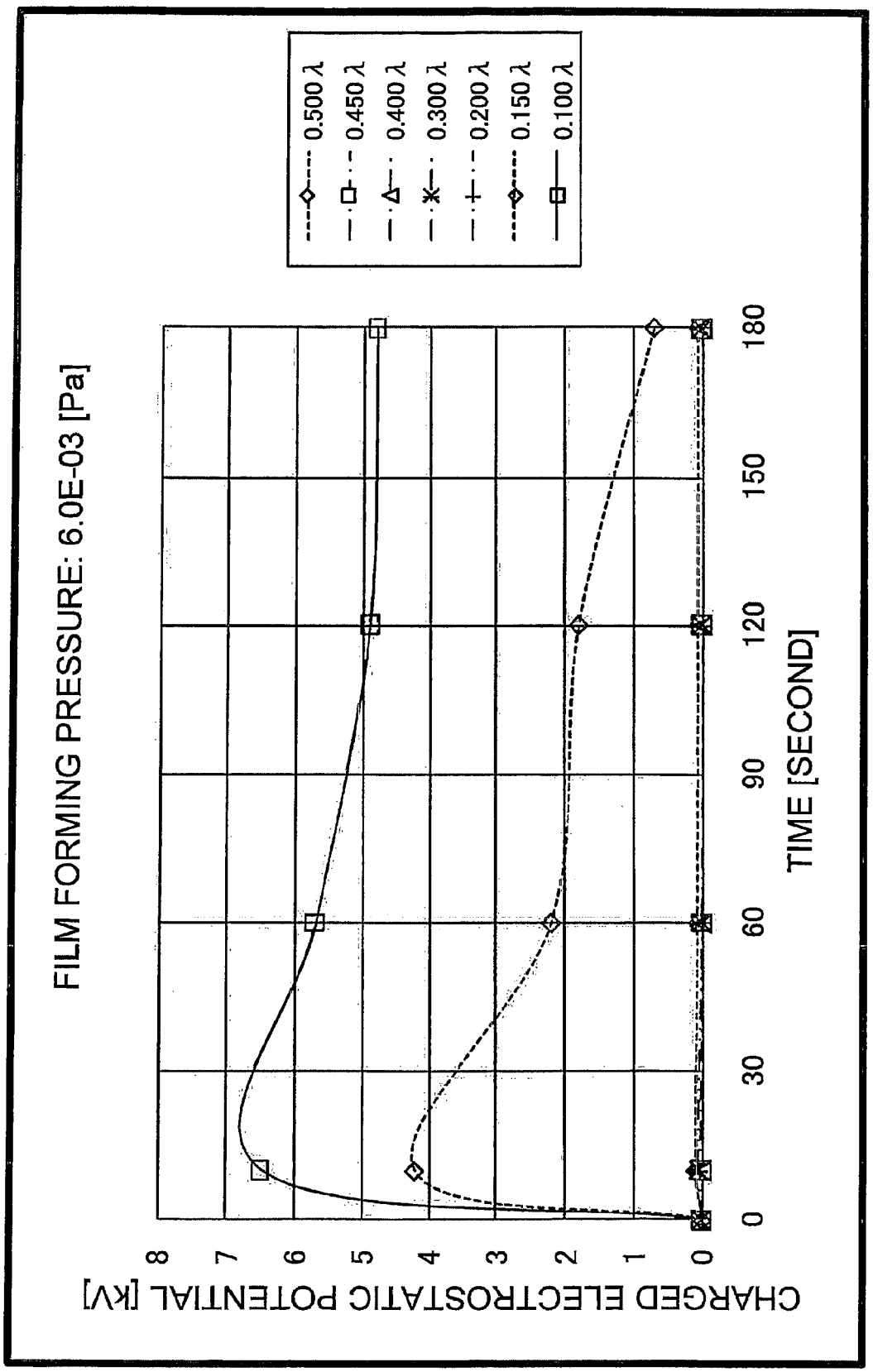

FIG.8A

| LAYER | DEPOSITION MATERIAL | OPTICAL FILM THICKNESS | ION ASSISTANCE | FILM FORMING PRESSURE [Pa] |
|---|---|---|---|---|
| 1 | SiO2 | 0.074λ | - | - |
| 2 | TiO2 | 0.061λ | 500V-250mA | 1.0E-02 |
| 3 | SiO2 | 0.113λ | - | - |
| 4 | TiO2 | 0.180λ | 750V-250mA | 1.0E-02 |
| 5 | SiO2 | 0.061λ | 750V-250mA | - |
| 6 | TiO2 | 0.168λ | 750V-250mA | 1.0E-02 |
| 7 | SiO2 | 0.273λ | 750V-250mA | - |

WAVELENGTH λ= 500 nm

FIG.8B

| LAYER | DEPOSITION MATERIAL | OPTICAL FILM THICKNESS | ION ASSISTANCE | FILM FORMING PRESSURE [Pa] |
|---|---|---|---|---|
| 1 | SiO2 | 0.074λ | - | - |
| 2 | TiO2 | 0.061λ | 500V-250mA | 1.0E-02 |
| 3 | SiO2 | 0.113λ | - | - |
| 4 | TiOx | 0.185λ | 750V-250mA | 5.0E-03 |
| 5 | SiO2 | 0.061λ | 750V-250mA | - |
| 6 | TiO2 | 0.168λ | 750V-250mA | 1.0E-02 |
| 7 | SiO2 | 0.273λ | 750V-250mA | - |

WAVELENGTH λ= 500 nm

FIG.8C

| LAYER | DEPOSITION MATERIAL | OPTICAL FILM THICKNESS | ION ASSISTANCE | FILM FORMING PRESSURE [Pa] |
|---|---|---|---|---|
| 1 | SiO2 | 0.074λ | - | - |
| 2 | TiO2 | 0.061λ | 500V-250mA | 1.0E-02 |
| 3 | SiO2 | 0.113λ | - | - |
| 4 | TiO2 | 0.180λ | 750V-250mA | 1.0E-02 |
| 5 | SiO2 | 0.061λ | 750V-250mA | - |
| 6 | TiOx | 0.173λ | 750V-250mA | 5.0E-03 |
| 7 | SiO2 | 0.273λ | 750V-250mA | - |

WAVELENGTH λ= 500 nm

FIG.8D

| LAYER | DEPOSITION MATERIAL | OPTICAL FILM THICKNESS | ION ASSISTANCE | FILM FORMING PRESSURE [Pa] |
|---|---|---|---|---|
| 1 | SiO2 | 0.074λ | - | - |
| 2 | TiO2 | 0.061λ | 500V-250mA | 1.0E-02 |
| 3 | SiO2 | 0.113λ | - | - |
| 4 | TiOx | 0.185λ | 750V-250mA | 6.0E-03 |
| 5 | SiO2 | 0.061λ | 750V-250mA | - |
| 6 | TiO2 | 0.168λ | 750V-250mA | 1.0E-02 |
| 7 | SiO2 | 0.273λ | 750V-250mA | - |

WAVELENGTH λ= 500 nm

FIG.10A

| | | COMPARATIVE EXAMPLE 1 | MULTILAYER FILM 1 | MULTILAYER FILM 2 | COMPARATIVE EXAMPLE 2 |
|---|---|---|---|---|---|
| CHARGED ELECTRO-STATIC POTENTIAL [kV] | INITIAL STATE | 0.00 | 0.00 | 0.00 | 0.00 |
| | IMMEDIATELY AFTER RUB FOR 10 SECONDS | 5.40 | 0.03 | 0.88 | 7.40 |
| | AFTER 1 MINUTE | 3.20 | 0.03 | 0.68 | 3.80 |
| | AFTER 2 MINUTES | 2.60 | 0.02 | 0.37 | 3.20 |
| | AFTER 3 MINUTES | 2.60 | 0.02 | 0.36 | 2.70 |
| STEEL WOOL ADHESION | | × | ○ | ○ | × |
| ANTI-STATIC PROPERTIES | | × | ○ | ○ | × |

FIG.11

| | COMPARATIVE EXAMPLE 1 | MULTILAYER FILM 1 | MULTILAYER FILM 2 | COMPARATIVE EXAMPLE 2 |
|---|---|---|---|---|
| COLORING | ○ | ○ | ○ | ○ |
| AFTER XENON IRRADIATION FOR 120 HOURS | ○ | ○ | ○ | ○ |
| ALKALINE ARTIFICIAL SWEAT | ○ | ○ | ○ | ○ |
| TAP WATER BOILING TEST | ○ | ○ | ○ | ○ |
| CONSTANT TEMPERATURE AND HUMIDITY TEST (7 DAYS) | ○ | ○ | ○ | ○ |

FIG.12A

| | | COMPARATIVE EXAMPLE 1 | MULTILAYER FILM 1 | MULTILAYER FILM 2 | COMPARATIVE EXAMPLE 2 |
|---|---|---|---|---|---|
| CHARGED ELECTRO-STATIC POTENTIAL [kV] | INITIAL STATE | 0.00 | 0.00 | 0.00 | 0.00 |
| | IMMEDIATELY AFTER RUB FOR 10 SECONDS | 4.80 | 0.00 | 0.30 | 4.50 |
| | AFTER 1 MINUTE | 2.00 | 0.00 | 0.14 | 2.30 |
| | AFTER 2 MINUTES | 1.90 | 0.00 | 0.10 | 1.80 |
| | AFTER 3 MINUTES | 1.60 | 0.00 | 0.08 | 1.50 |
| STEEL WOOL ADHESION | | × | ○ | ○ | × |
| ANTI-STATIC PROPERTIES | | × | ○ | ○ | × |

FIG.13A

| | | COMPARATIVE EXAMPLE 1 | MULTILAYER FILM 1 | MULTILAYER FILM 2 | COMPARATIVE EXAMPLE 2 |
|---|---|---|---|---|---|
| CHARGED ELECTRO-STATIC POTENTIAL [kV] | INITIAL STATE | 0.00 | 0.00 | 0.00 | 0.00 |
| | IMMEDIATELY AFTER RUB FOR 10 SECONDS | 5.40 | 0.05 | 0.38 | 3.50 |
| | AFTER 1 MINUTE | 1.30 | 0.01 | 0.10 | 0.59 |
| | AFTER 2 MINUTES | 1.06 | 0.00 | 0.03 | 0.24 |
| | AFTER 3 MINUTES | 0.88 | 0.00 | 0.00 | 0.08 |
| STEEL WOOL ADHESION | | × | ○ | ○ | × |
| ANTI-STATIC PROPERTIES | | × | ○ | ○ | × |

OPTICAL MEMBER, PLASTIC LENS FOR EYEGLASSES, AND METHOD FOR MANUFACTURING THE SAME

This application claims the entire benefit of Japanese Patent Application Number 2009-089456 filed on Apr. 1, 2009, the entirety of which is incorporated by reference.

BACKGROUND OF THE INVENTION

1. Field of the Invention

The present invention relates to optical members including optical lenses such as plastic lenses and glass lenses used for, for example, eyeglasses and methods for manufacturing the same.

2. Description of Related Art

Japanese Translation of PCT International Application No. 2007-520738 A discloses a conventionally known color lens for eyeglasses as an example of optical members. An anti-reflective coating of the lens has at least two visible light absorbing layers containing substoichiometric titanium oxides of TiOx (x<2).

However, the lens is necessarily colored gray or similar colors due to the visible light absorbing layers containing substoichiometric titanium oxides and cannot include TiOx (x<2) without coloring (visible light absorption). It is described that the lens has a uniform color and anti-ultraviolet properties, but there is no description about anti-static properties. An electrically charged optical member is likely to adsorb dust, and in particular, charged eyeglasses increase the frequency of maintenance such as wiping. The wiping of grime or dust at the time of the maintenance generates static electricity, and the lens surface even adsorbs grime or dust. The lens is wiped in such a condition to involve the grime or dust, and as a result, the lens surface is scratched. It is supposed in other optical members that the adhesion of grime or dust may cause an appearance defect such as scratches in a similar manner. Therefore, the optical members desirably have anti-static properties.

SUMMARY OF THE INVENTION

An object of the present invention is to provide an optical member and a method for manufacturing the optical member that does not impair the anti-reflective properties but has excellent transmission properties and anti-static properties, which suppress the adhesion of grime or dust so that it is unlikely to be scratched.

In order to achieve the object described above, a first aspect of the present invention relates to an optical member including a substoichiometric titanium oxide film formed by depositing substoichiometric titanium oxides in a vacuum chamber into which an oxygen gas for adjusting a vacuum is introduced. In the optical member, a film forming pressure p (Pa) in the vacuum chamber and an optical film thickness (a refractive index of 2.50, a wavelength of 500 nm) of the substoichiometric titanium oxide film have relations (1) $p \geq 0.005$, (2) optical film thickness $\leq 0.500\lambda$, and (3) optical film thickness $\geq (0.001\exp(905.73p) - 0.050)\lambda$ where exp is an exponential function with e as a base of natural logarithm.

As a first specific embodiment in accordance with the first aspect, a relation (3-1) optical film thickness $\geq (0.001\exp(905.73p))\lambda$ where exp is an exponential function with e as a base of natural logarithm is employed in place of the relation (3).

As a second specific embodiment in accordance with the first aspect, (3-2) optical film thickness $\geq (0.001\exp(905.73p) + 0.050)\lambda$ where exp is an exponential function with e as a base of natural logarithm is employed in place of the relation (3).

As a third embodiment in accordance with the first aspect, the substoichiometric titanium oxide film is formed by depositing while being assisted by an oxygen ion and/or an argon ion or while being treated with plasma. Therefore, higher quality would be provided.

Furthermore, as a fourth embodiment in accordance with the first aspect, the substoichiometric titanium oxide film is a high refractive index layer in an anti-reflective coating containing a low refractive index layer and the high refractive index layer, so that better matching to the anti-reflective properties is achieved.

As a fifth embodiment in accordance with the first aspects, a plastic lens for eyeglasses uses the optical member described above.

As a sixth aspect in accordance with the sixth aspect, the plastic lens having hard coating layers.

A second aspect of the present invention is a method for manufacturing an optical member including depositing substoichiometric titanium oxides in a vacuum chamber into which an oxygen gas for adjusting a vacuum is introduced to form a substoichiometric titanium oxide film on a substrate. In the method, a film forming pressure p (Pa) in the vacuum chamber and an optical film thickness (a refractive index of 2.50, a wavelength of 500 nm) of the substoichiometric titanium oxide film have relations (1) $p \geq 0.005$, (2) optical film thickness $\leq 0.500\lambda$, and (3) optical film thickness $\geq (0.001\exp(905.73p) - 0.050)\lambda$ where exp is an exponential function with e as a base of natural logarithm.

As an embodiment in accordance with the second aspect, the deposition is carried out while being assisted by an oxygen ion and/or an argon ion or while being treated with plasma, so that the higher quality can be obtained.

Further, as a second embodiment in accordance with the second aspect, the substoichiometric titanium oxide film is formed as a high refractive index layer in an anti-reflective coating containing a low refractive index layer and the high refractive index layer. Therefore, better matching to the anti-reflective properties is achieved.

A third aspect of the present invention is a plastic lens for eyeglasses using the manufacturing method described above.

With the method of the present invention, an optical member satisfying both high transmission properties and high anti-static properties can be provided by forming substoichiometric titanium oxides under conditions of film forming pressure $p \geq 0.005$ and $(0.001\exp(905.73p) - 0.050)\lambda \leq$ optical film thickness $\geq 0.500\lambda$.

BRIEF DESCRIPTION OF THE DRAWINGS

FIG. 1 is a table relating to characteristics of the present invention and comparative examples.

FIG. 2 shows graphs relating to the measurement of absorptance in FIG. 1.

FIG. 3 shows graphs relating to the charged electrostatic potentials in FIG. 1, FIG. 3B is the graph relating to a TiOx layer having an optical film thickness of $0.050\lambda$.

FIG. 4 is a table relating to characteristics of the present invention and comparative examples.

FIG. 5 shows tables relating to charged electrostatic potentials in FIG. 4, FIG. 5A is the table relating to a film forming pressure of 6.7×10$^{-3}$ Pa, FIG. 5B is the table relating to a film forming pressure of 6.0×10$^{-3}$ Pa, FIG. 5C is the table relating to a film forming pressure of 5.0×10$^{-3}$ Pa, and FIG. 5D is the table relating to a film forming pressure of 5.5×10$^{-3}$ Pa.

FIG. 6 shows graphs relating to charged electrostatic potentials in FIG. 4, FIG. 6B is the graph relating to a film forming pressure of 6.0×10$^{-3}$ Pa.

FIG. 8 shows tables indicating the structures and manufacturing conditions of multilayer films of the anti-reflective coating, FIG. 8A is the table relating to Comparative Example 1, FIG. 8B is the table relating to a multilayer film 1 of the present invention, FIG. 8C is the table relating to a multilayer film 2 of the present invention, and FIG. 8D is the table relating to Comparative Example 2.

FIG. 10A is a table showing the charged electrostatic potential and the like of a lens having each multilayer film in FIG. 8.

FIG. 11 is a table relating to characteristics and the like of a lens having each multilayer film in FIG. 8.

FIG. 12A is a table showing charged electrostatic potentials and the like of a lens having each multilayer film in FIG. 8 after ultraviolet irradiation.

FIG. 13A is a table showing charged electrostatic potentials and the like of a lens having each multilayer film in FIG. 8 after standing in an environment at a constant temperature and humidity.

DETAILED DESCRIPTION OF THE INVENTION

Figure 2A:
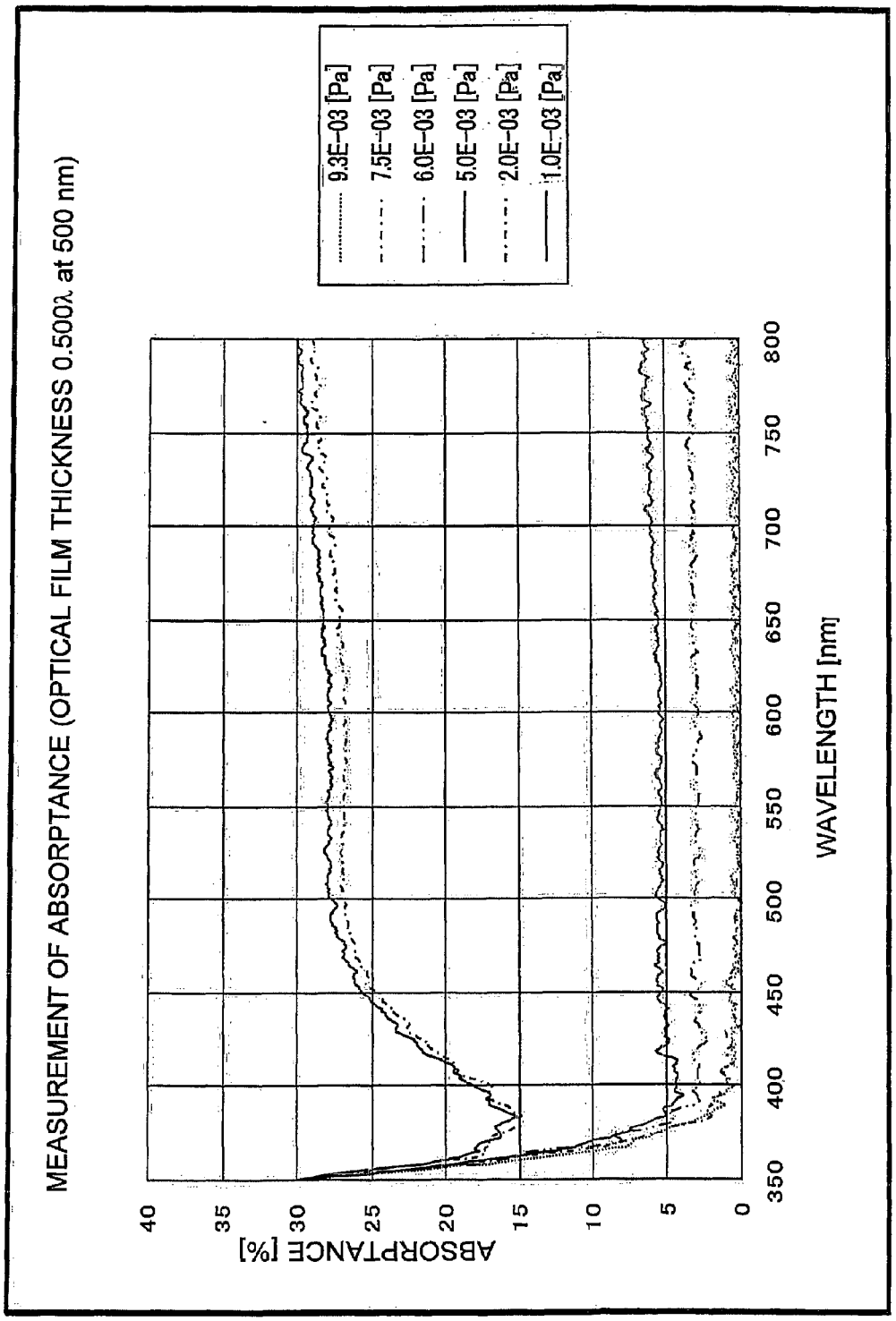
FIG. 2A is the graph relating to a TiOx layer having an optical film thickness of $0.500\lambda$.

Hereinafter, examples of embodiments of the present invention will be described based on drawings as appropriate. The embodiment of the present invention is not limited to the examples.

[Single Layer Film]

The optical member is a lens having a glass or plastic substrate. Examples of the plastic substrate include an acrylic resin, a polycarbonate resin, a polyurethane resin, a polyester resin, an episulfide resin, a polyethersulfone resin, a poly-4-methylpentene-1 resin, and a diethylene glycol bis(allyl carbonate) resin. Examples suitable for a lens having a high refractive index include a polyurethane resin obtained by addition polymerization of a polyisocyanate compound and a polythiol and/or a sulfur-containing polyol. Furthermore, examples of the plastic having a high refractive index include an episulfide resin obtained by addition polymerization of an episulfide group and a polythiol and/or a sulfur-containing polyol.

The plastic substrate has a surface on which a known hard coat layer is formed. The hard coat layer is preferably an organosiloxane hard coat layer but may be formed from another organic silicic acid compound or an acrylic compound. The glass substrate and the plastic substrate having the hard coat layer have surfaces on which a single TiOx layer (a substoichiometric titanium oxide film) composed of substoichiometric titanium oxides of TiOx (x<2) is formed. x is less than 2 but a value near 2. Even when the film structure is changed by omitting the hard coat layer or by adding another layer, the TiOx layer provides a similar performance.

The TiOx layer is formed as described below. Namely, a glass substrate and a plastic substrate having a hard coat layer were placed in a vacuum chamber while exposing each surface. Into the vacuum chamber, oxygen gas was introduced so as to achieve a predetermined film forming pressure. In an oxygen atmosphere, TiOx was formed on each surface of the glass substrate and the plastic substrate having a hard coat layer by deposition through a reaction shown below. As the deposition material, trititanium pentoxide (OS-50 manufactured by Canon Optron. Inc.) was used, but common titanium oxides may be used.

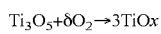

$$Ti_3O_5 + \delta O_2 \rightarrow 3TiOx$$

The value x (substoichiometric value) in TiOx can be finely controlled by the introduction amount of oxygen gas introduced into the vacuum chamber (vacuum atmosphere) during film formation, and the film forming pressure is determined by the introduction amount of oxygen gas. Namely, a higher film forming pressure leads to a larger introduction amount of oxygen gas, and hence x approaches 2. A lower film forming pressure leads to a smaller introduction amount of oxygen gas, and hence x is less than 2.

With respect to each of 13 glass substrates (a refractive index of 1.52), a TiOx layer was formed at the pressure shown in the column "film forming pressure [Pa]" in the table shown in FIG. 1 so as to have the film thickness in the column "optical film thickness (λ=500 nm)" to manufacture a glass lens. Namely, eight different film forming pressures were employed. Among them, at each of five different pressures, a lens having an optical film thickness of 0.500λ and a lens having an optical film thickness of 0.050λ were manufactured. At another pressure, a lens having an optical film thickness of 0.500λ was manufactured, and at each of two remaining pressures, a lens having an optical film thickness of 0.050λ was manufactured.

In a similar manner, with respect to each of 13 plastic substrates having hard coat layers (refractive index of 1.60), a TiOx layer was formed to manufacture a plastic lens.

On these 13 pairs of the lenses, the appearances (in particular, the edge parts) were observed whether the lenses were colored or not. In the column "appearance color" in the table in FIG. 1, the lenses shown by "◯" were not colored while the lenses shown by "x" were obviously colored.

On each glass lens, the transmittance and reflectance were determined using a spectrophotometer (U-4100 manufactured by Hitachi, Ltd.). Based on both results, each optical absorptance in a visible light region was determined from the equation below.

Absorptance [%]=100−transmittance [%]+ reflectance [%]

Figure 2B:
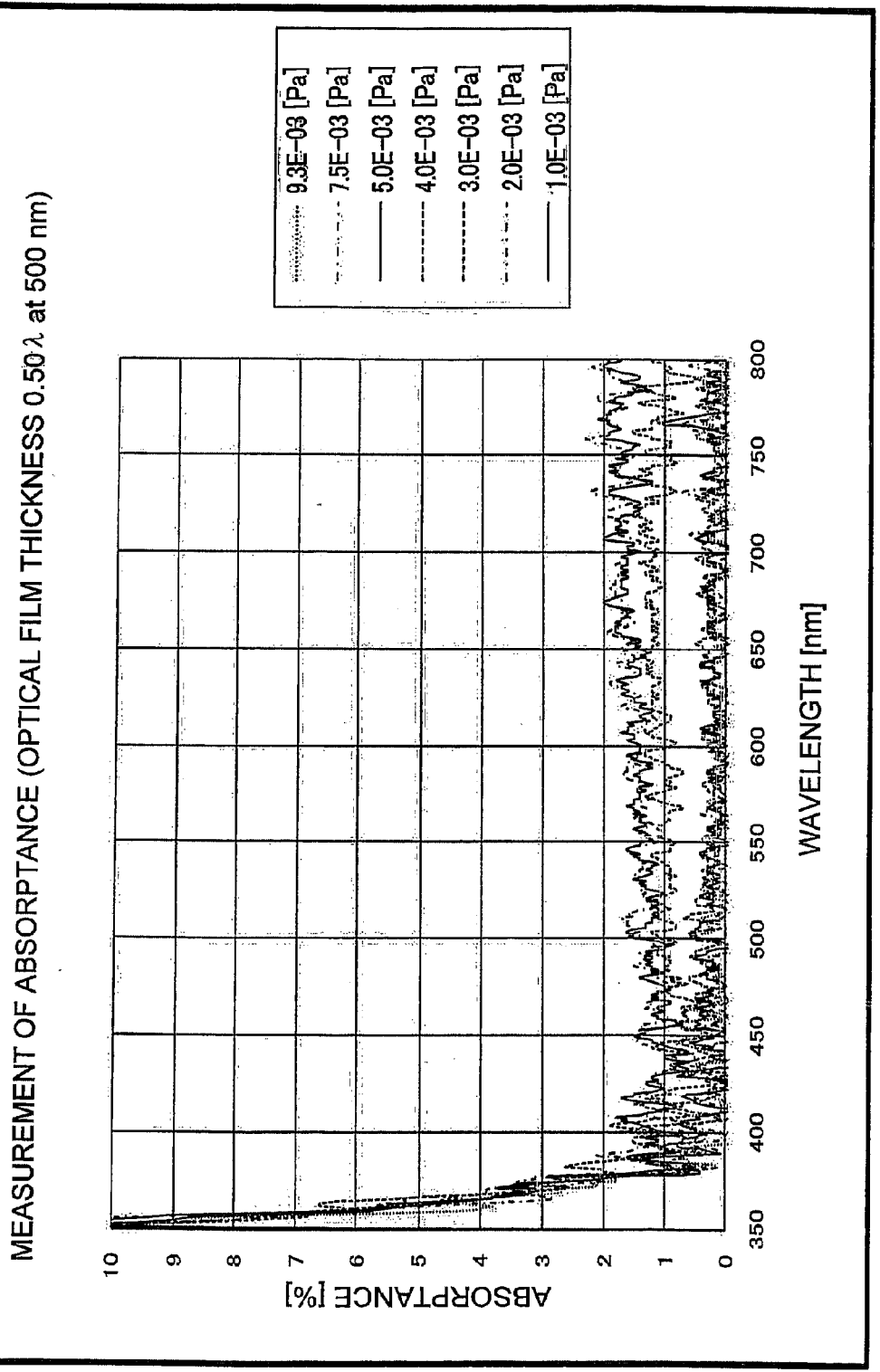
FIG. 2B is the graph relating to a TiOx layer having an optical film thickness of $0.050\lambda$.

The absorptances (percent) at 550 nm are shown in the column "absorptance [%] at 550 nm" in the table in FIG. 1, and the graph of the results is shown in FIG. 2. The results revealed that the lens having an optical film thickness of 0.500λ formed at a pressure of less than about 5.0×10$^{-3}$ Pa was not able to ensure the transparency and that the lens having an optical film thickness of 0.050λ did not particularly have any problem about the transparency.

The surface of each plastic lens was rubbed with nonwoven fabric (pure leaf manufactured by OZU CORPORATION) for 10 seconds. At the initial state, immediately after the rub, and 1 minute, 2 minutes, and 3 minutes after the initial state, each charged electrostatic potential on the surface was measured with an electrostatic fieldmeter (FMX-003 manufactured by SIMCO JAPAN). For adhesion test, the surface was rubbed with nonwoven fabric for 10 seconds in a similar manner to that above and then was moved close to steel wool powder. Whether the steel wool powder adheres to the lens surface was observed to determine the degree of static electrification.

Figure 3A:
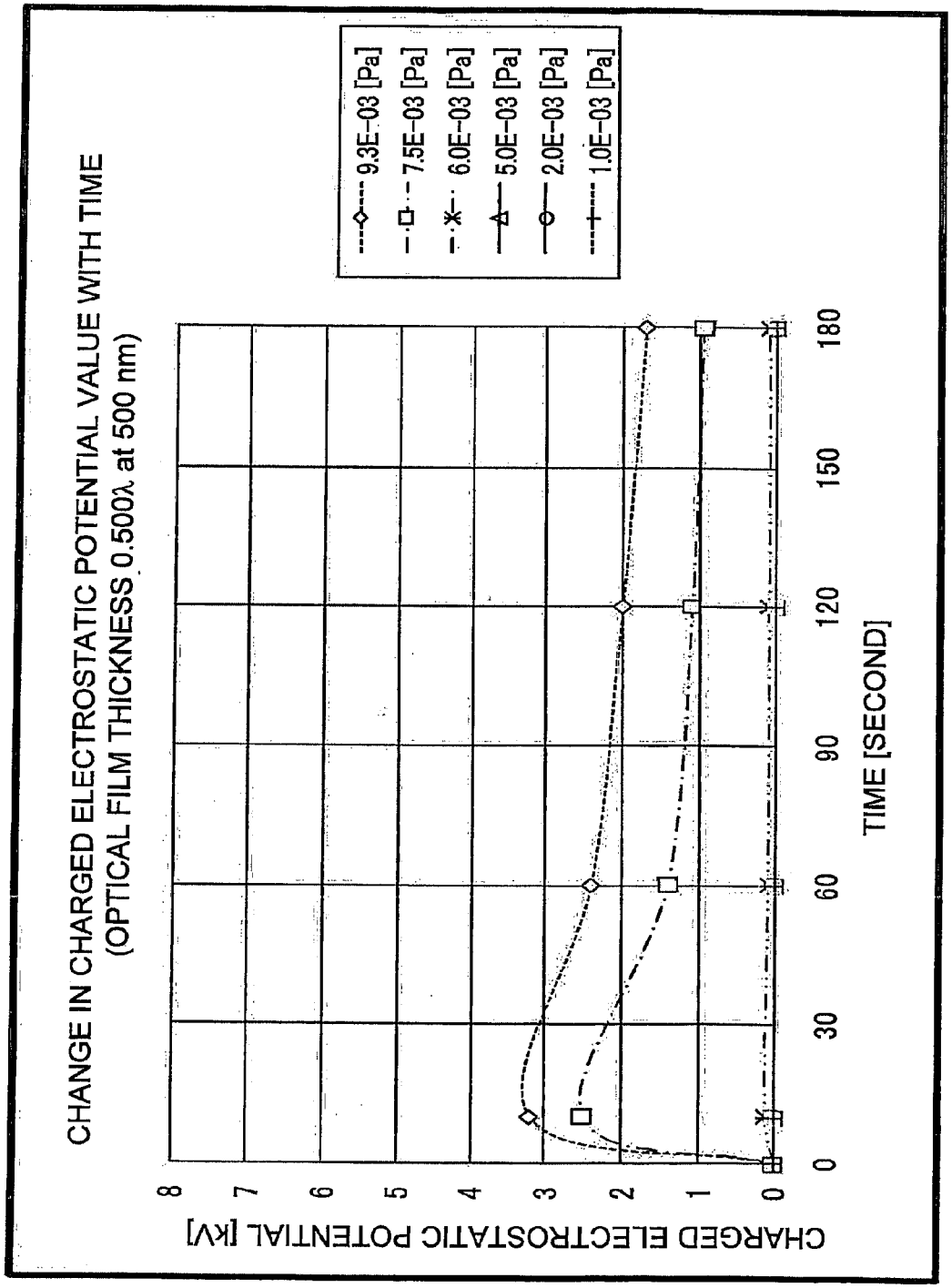
FIG. 3A is the graph relating to a TiOx layer having an optical film thickness of $0.500\lambda$.

The column "initial state" in the table in FIG. 1 shows each electric potential (kV, kilovolt, absolute value, hereinafter the same meaning is applied) immediately before the rub, and the columns "immediately after rub for 10 seconds", "after 1 minute", "after 2 minutes", and "after 3 minutes" show corresponding electric potentials. FIG. 3 shows the graphs relating to these electric potentials. Furthermore, the column "steel wool adhesion" in the table in FIG. 1 shows the presence or absence of the adhesion, and the absence of the adhesion is represented by "○", and the presence of the adhesion is represented by "x".

From these electric potentials and the state whether the steel wool adheres (the steel wool adheres to a charged lens), the anti-static properties of each lens were evaluated, and the results are as shown in the column "anti-static properties" in the table in FIG. 1. Namely, the lenses represented by "○" have favorable anti-static properties, and those represented by "x" have relatively poor anti-static properties.

Then, from the viewpoints of the transmission properties and the anti-static properties, within a range of the film forming pressure where both the high transmission properties and the high anti-static properties may be satisfied, 32 pairs, 64 lenses having various film thicknesses were further manufactured in a similar manner to that above. Namely, as shown in the columns "film forming pressure [Pa]" and "optical film thickness (λ=500 nm)" in the table in FIG. 4, two pairs of lenses having optical film thicknesses of 0.500λ and 0.050λ were manufactured at a film forming pressure of 7.5×10$^{-3}$ Pa, ten pairs of lenses having optical film thicknesses of 0.500λ to 0.050λ, (every 0.050λ) were manufactured at a film forming pressure of 6.7×10$^{-3}$ Pa, seven pairs of lenses having optical film thicknesses of 0.500λ to 0.100λ(every 0.050λ, except for 0.350λ and 0.250λ) were manufactured at a film forming pressure of 6.0×10$^{-3}$ Pa, two pairs of lenses having optical film thicknesses of 0.200λ and 0.150λ were manufactured at a film forming pressure of 5.5×10$^{-3}$ Pa, seven pairs of lenses having optical film thicknesses of 0.500λ to 0.050λ (every 0.050λ, except for 0.450λ, 0.350λ, and 0.250λ) were manufactured at a film forming pressure of 5.0×10$^{-3}$ Pa, a pair of lenses having an optical film thickness of 0.050λ were manufactured at a film forming pressure of 4.0×10$^{-3}$ Pa, a pair of lenses having an optical film thickness of 0.050λ were manufactured at a film forming pressure of 3.0×10$^{-3}$ Pa, and two pairs of lenses having optical film thicknesses of 0.500λ and 0.050λ were manufactured at a film forming pressure of 2.0×10$^{-3}$ Pa. The transmission properties and the anti-static properties of each lens were measured in a similar manner to that above.

The column "anti-static properties" in the table in FIG. 4 shows each anti-static property that is evaluated form the measurement of charged electrostatic potential and the results of the steel wool powder adhesion in a similar manner to that above, where the lenses having favorable antistatic properties are represented by "○" and the lenses having comparatively poor antistatic properties are represented by "x" as described above. The column "coloring" shows each transparency evaluated from the results of the appearance observation and the calculated absorptance in a similar manner to that above, where the lenses having favorable transparency are represented by "○", and the lenses having comparatively poor transparency are represented by "x".

Both the transmission properties and the anti-static properties are satisfied by the lenses that are formed at a film forming pressure of 6.7×10$^{-3}$ Pa and that have an optical film thickness of 0.500λ or 0.450λ, the lenses that are formed at a film forming pressure of 6.0×10$^{-3}$ Pa and that have an optical film thickness of 0.500λ to 0.200λ, the lenses that are formed at a film forming pressure of 5.5×10$^{-3}$ Pa and that have an optical film thickness of 0.200λ or 0.150λ, and the lenses that are formed at a film forming pressure of 5.0×10$^{-3}$ Pa and that have an optical film thickness of 0.500λ to 0.100λ. The lens that was formed at a film forming pressure of 2.0×10$^{-3}$ Pa and that had an optical film thickness of 0.050λ satisfied both the properties. However, optical absorption was observed with an optical film thickness meter during the film formation of the TiOx layer, and hence the lens is inferior as an optical member at this point.

Figure 6A:
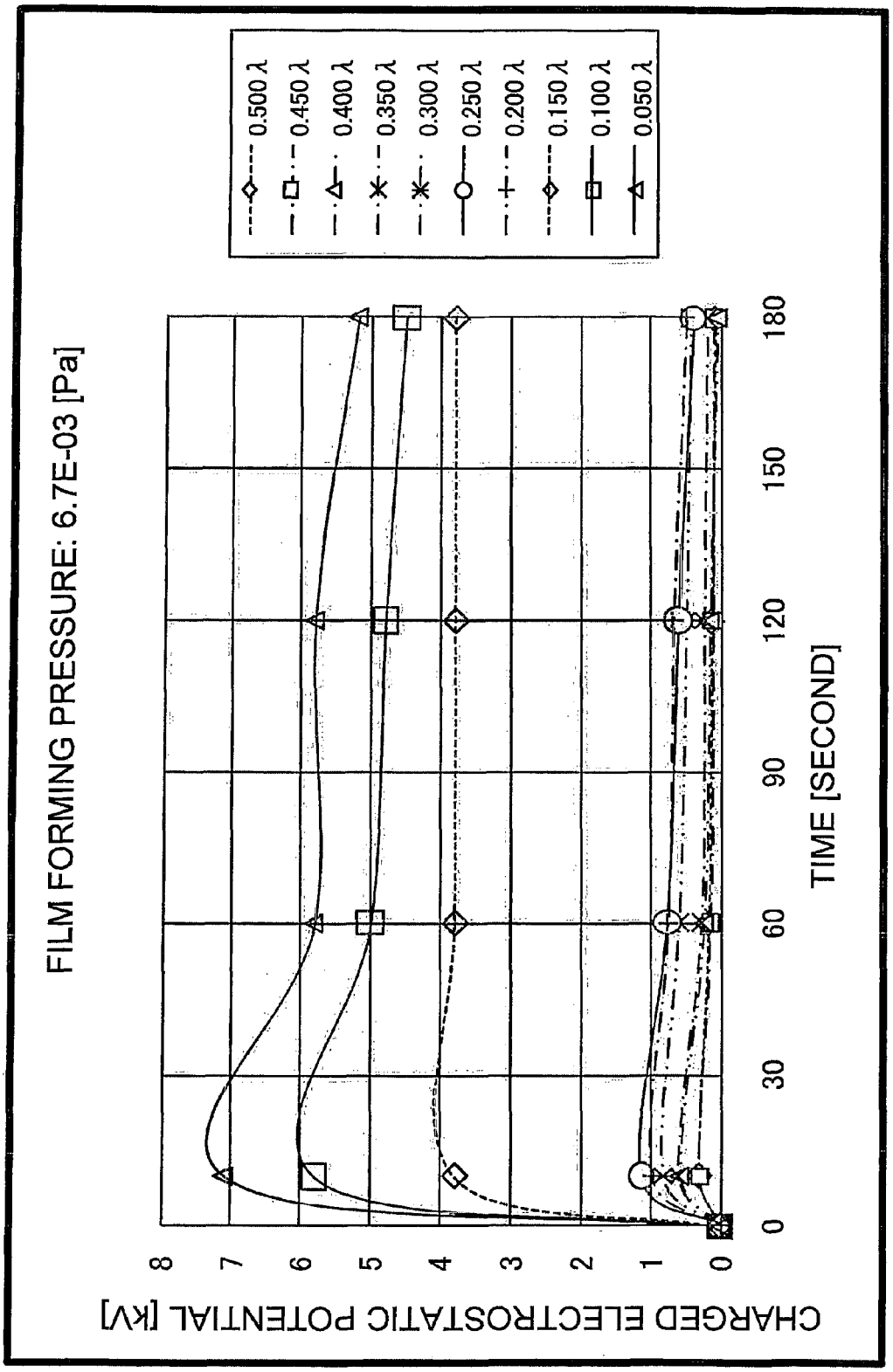
FIG. 6A is the graph relating to a film forming pressure of 6.7×10$^{-3}$ Pa.
Figure 6C:
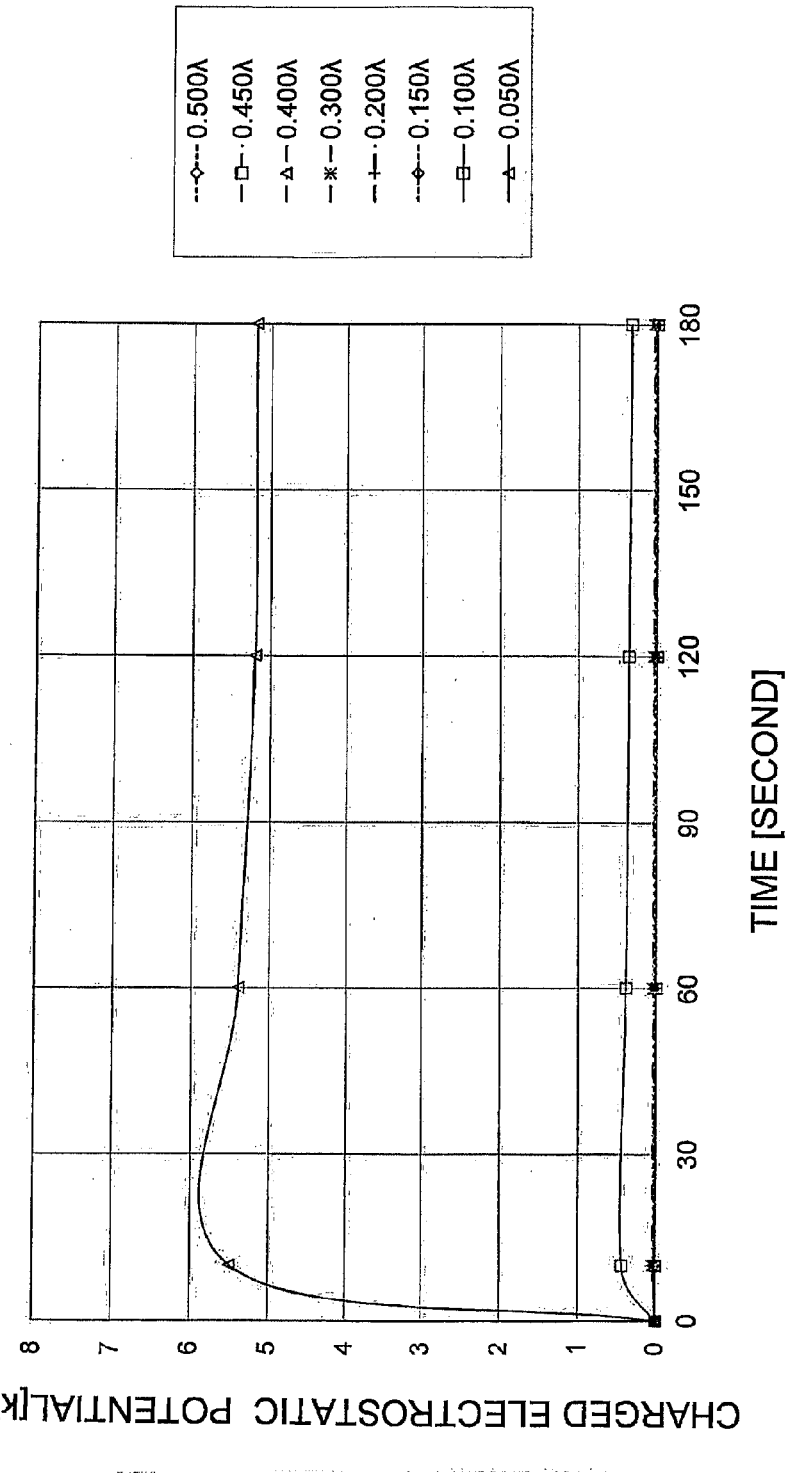
FIG. 6C is the graph relating to a film forming pressure of 5.0×10$^{-3}$ Pa.
Figure 6D:
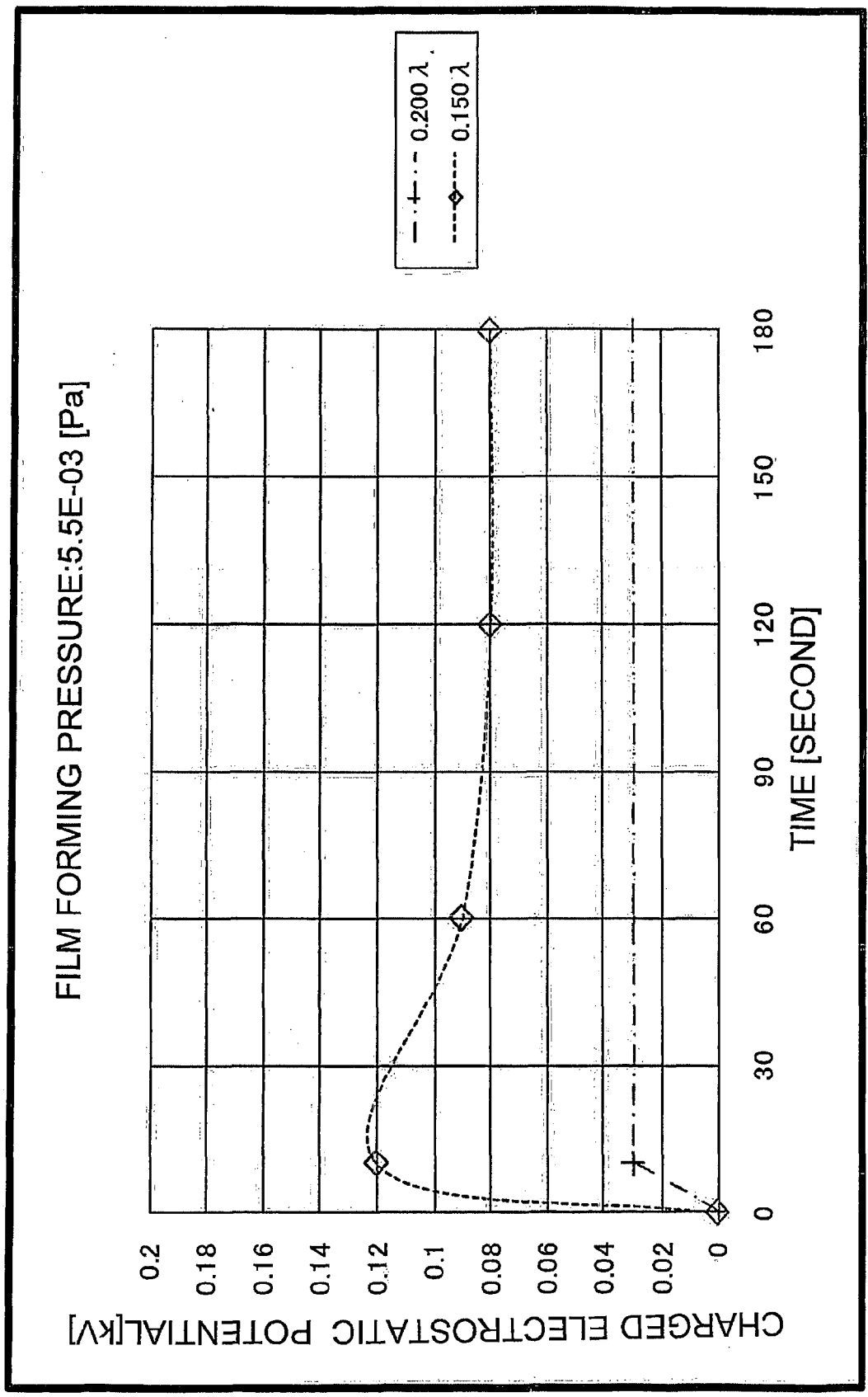
FIG. 6D is the graph relating to a film forming pressure of 5.5×10$^{-3}$ Pa.

FIG. 5 shows the results of the measurement of charged electrostatic potential as with FIG. 1, and FIG. 6 shows the graphs of the results as with FIG. 3. In the column "steel wool adhesion", "Δ" represents a little adhesion, and in the column "anti-static properties", "Δ" represents a lens not having high anti-static properties to the extent that steel wool powder does not adhere even when the lens is rubbed, but having anti-static properties to the extent of not strongly but weakly drawing steel wool.

From the results above, in order to hold the high transmission properties and the high anti-static properties, the following conditions should be satisfied.

Namely, the optical film thickness is 0.500λ or less as shown below because a lens having an optical film thickness of more than 0.500λ affects the optical characteristics of the TiOx film.

$$\text{Optical film thickness} \leq 0.500\lambda$$

Subsequently, in order to prevent the optical absorption with an optical film thickness meter, the film forming pressure p is 5.0×10$^{-3}$ (0.005) Pa or more where the optical absorption does not occur in the TiOx film with the optical film thickness meter.

$$P \geq 0.005$$

Next, with respect to each film forming pressure p, the lower limit of the optical film thickness that can satisfy both the anti-static properties and the transparency (colorless) is discussed. FIGS. 1 to 6 (especially FIG. 4) show that the lower limit is 0.450λ for a film forming pressure of 6.7×10$^{-3}$ Pa, the lower limit is 0.200λ for a film forming pressure of 6.0×10$^{-3}$ Pa, the lower limit is 0.150λ for a film forming pressure of 5.5×10$^{-3}$ Pa, and the lower limit is 0.100λ for a film forming pressure of 5.0×10$^{-3}$ Pa.

Figure 7:
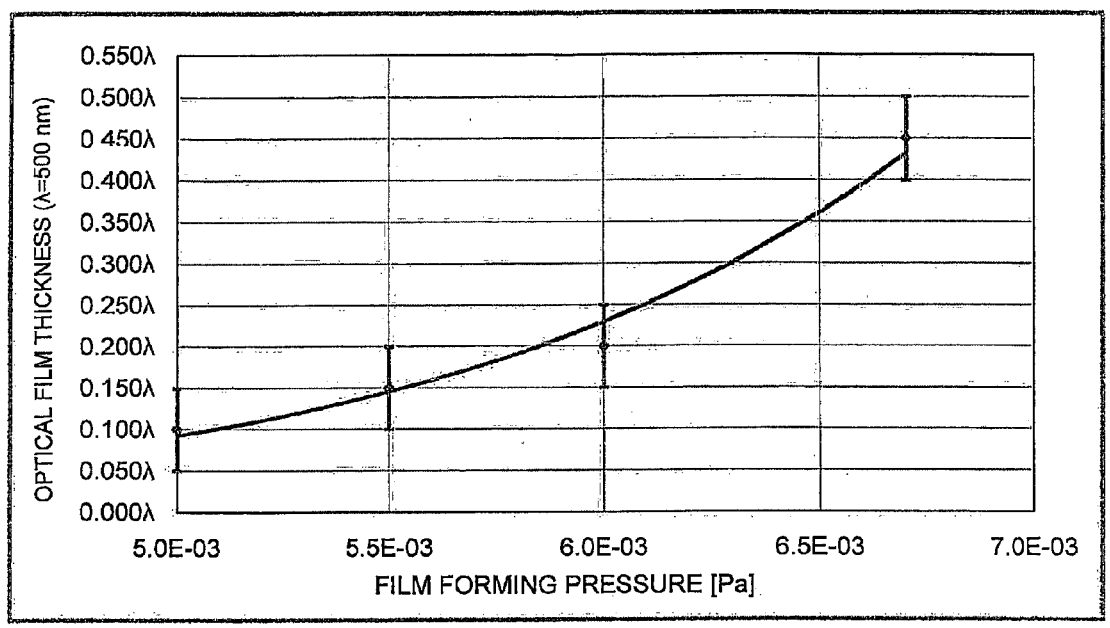
FIG. 7 is a graph showing the relation between the film forming pressure p and the lower limit of the optical film thickness.

FIG. 7 is a graph showing the relation between the film forming pressure p and the lower limit of the optical film thickness. The optical film thickness may include an error of plus or minus about 0.050λ depending on, for example, refractive index variations caused by vacuum error, and thus the error range is regarded as ±0.050λ.

In the graph, four relations between the film forming pressure p and the optical film thickness including the error range are plotted. Then, these four plots are fitted to an exponential function with e as the base of the natural logarithm {optical film thickness=(a×exp(b×p))λ} so as to give the least error to the plots (by the method of least squares) to give a=0.001 and b=905.73.

Moreover, the lower limit of the error relating to the optical film thickness (−0.050λ for optical film thickness) is considered to give the first equation below. The second equation without consideration of the error (the second equation shown in FIG. 7) may be adopted, or the third equation considering the upper limit of the error (+0.050, for optical film thickness) may be adopted to allow the error for higher performance.

Optical film thickness=$(0.001\exp(905.73p)-0.050)\lambda$.

Optical film thickness=$(0.001\exp(905.73p))\lambda$.

Optical film thickness=$(0.001\exp(905.73p)+0.050)\lambda$.

These equations relate to the lower limit of the optical film thickness for satisfying both the anti-static properties and the transparency, and thus the range of the optical film thickness that satisfies both the anti-static properties and the transparency is the first equation shown below in addition to the equation of film thickness $\leq 0.500\lambda$. The second or third equation may also be adopted.

Optical film thickness$\geq(0.001\exp(905.73p)-0.050)\lambda$.

Optical film thickness$\geq(0.001\exp(905.73p))\lambda$.

Optical film thickness$\geq(0.001\exp(905.73p)+0.050)\lambda$.

The relation between the film forming pressure p and the optical film thickness for highly satisfying both the high anti-static properties and the high transparency is summarized as below, where exp is an exponential function with e as the base of the natural logarithm.

$$p \geq 0.005 \quad (1)$$

$$\text{optical film thickness} \leq 0.500\lambda \quad (2)$$

$$\text{optical film thickness} \geq (0.001\exp(905.73p)-0.050)\lambda \quad (3)$$

[Multilayer Film]

Adhering to the embodiment of the single layer film, the multilayer film to be described next is formed as an anti-reflective coating. Here, a low refractive index layer is formed from $SiO_2$ (silicon dioxide, a refractive index of 1.47), and a high refractive index layer is formed from a TiOx (a refractive index of 2.50) layer or $TiO_2$ (titanium dioxide, a refractive index of 2.43). A single TiOx layer is sufficient considering the anti-static properties of the single layer film. The low refractive index layer and the high refractive index layer may use a known film material such as $Al_2O_3$ (dialuminum trioxide), $Y_2O_3$ (diyttrium trioxide), $ZrO_2$ (zirconium dioxide), $Ta_2O_5$ (ditantalum pentoxide), $HfO_2$ (hafnium dioxide), and $Nb_2O_5$ (diniobium pentoxide).

On the anti-reflective coating, in order to improve water repellency and oil repellency of the lens surface or to prevent water spots, an antifouling coating layer composed of a fluorine compound is formed. The antifouling coating layer can be formed by a known method such as dipping, spin coating, spraying, and depositing.

FIG. 8A is a table showing Comparative Example 1 that uses $TiO_2$ but without the TiOx layer, FIGS. 8B and 8C are tables showing embodiments pertaining to the multilayer films (the multilayer films 1 and 2, respectively) of the present invention, and FIG. 8D is a table showing Comparative Example 2 that uses a TiOx layer that is formed beyond the range of the optical film thickness corresponding to the film forming pressure of the present invention.

In Comparative Example 1, the low refractive index layers and the high refractive index layers are alternately formed by a known method in the order from the first layer ($SiO_2$ layer), the second layer ($TiO_2$ layer) to the seventh layer ($SiO_2$ layer) on a substrate having a hard coat. The optical film thickness (wavelength $\lambda=500$ nm) of each layer is as shown in the table. For such formation of each layer, ion assistance is appropriately performed at an acceleration voltage (V, volt) and an acceleration current (mA, milliampere) shown in the table in order to improve film quality, and oxygen gas is appropriately introduced so as to reach the value shown in the "film forming pressure [Pa]". Here, the ion assistance is performed with an oxygen ion but may also be performed with other ions such as an argon ion. Plasma treatment may also be performed in place of the ion assistance or together with the ion assistance.

In the multilayer film 1, the first layer to the third layer are formed in a similar manner to that in Comparative Example, then the fourth layer as the TiOx layer is formed in a similar method to the film formation of the single layer film described above, and the fifth layer to the seventh layer are further formed in a similar manner to that in Comparative Example. The TiOx layer is formed in a similar manner to that in Comparative Example while the ion assistance is performed with an oxygen ion that is charged at 750 V and a current of 250 mA and oxygen gas is introduced. As a result, the TiOx layer having an optical film thickness of $0.185\lambda$ is formed at a film forming pressure of $5.0 \times 10^{-3}$ Pa with the ion assistance for an adjusted deposition time.

In the multilayer film 2, the first layer to the fifth layer are formed in a similar manner to that in Comparative Example, then the sixth layer as the TiOx layer is formed in a similar method to the film formation of the single layer film described above, and the seventh layer is further formed in a similar manner to that in Comparative Example. The TiOx layer having an optical film thickness of $0.173\lambda$ is formed at a film forming pressure of $5.0 \times 10^{-3}$ Pa with the ion assistance at 750 V and 250 mA for an adjusted deposition time.

In Comparative Example 2, such layers are formed in a similar manner to that in the multilayer film 1 except for the film forming pressure for the TiOx layer. The TiOx layer having an optical film thickness of $0.185\lambda$ is formed at a film forming pressure of $6.0 \times 10^{-3}$ Pa with the ion assistance at 750 V and 250 mA for an adjusted deposition time. In Comparative Example 2, the film has an optical film thickness of $0.185\lambda$ that is beyond the range of the optical film thickness (about $0.500\lambda$ to $0.200\lambda$ corresponding to a film forming pressure of $6.0 \times 10^{-3}$ Pa of the present invention.

Figure 9:
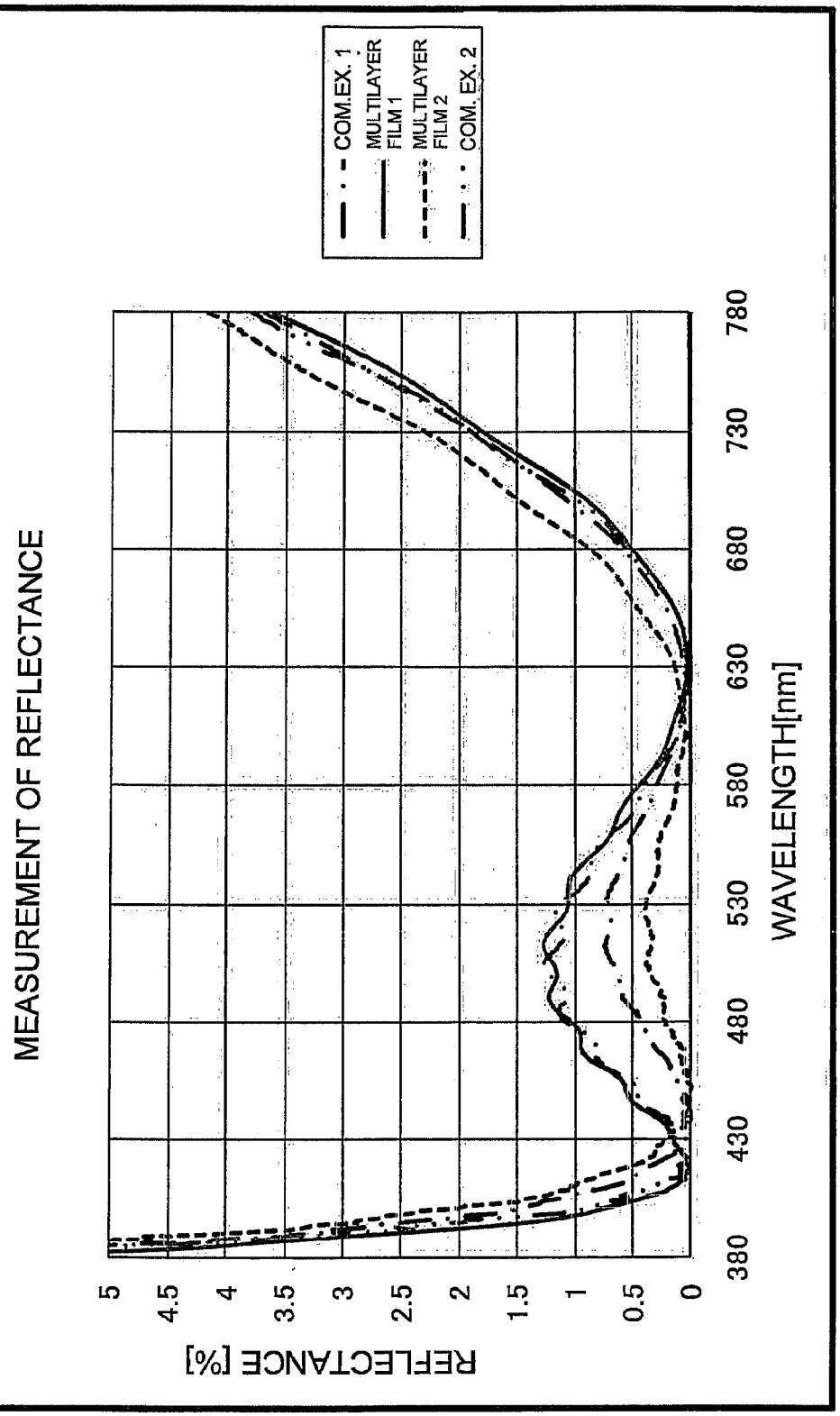
FIG. 9 is a graph relating to the measurement of reflectance of a lens having each multilayer film in FIG. 8.

The reflectance of each lens surface of Comparative Examples 1 and 2 and the multilayer films 1 and 2 (each one film) was measured in the visible light region, and the results are shown in FIG. 9. FIG. 9 shows that the reflectance characteristics of the multilayer films 1 and 2 and those of Comparative Examples 1 and 2 are substantially the same, that is, are equivalent with respect to the performance as the anti-reflective coating.

Figure 10B:
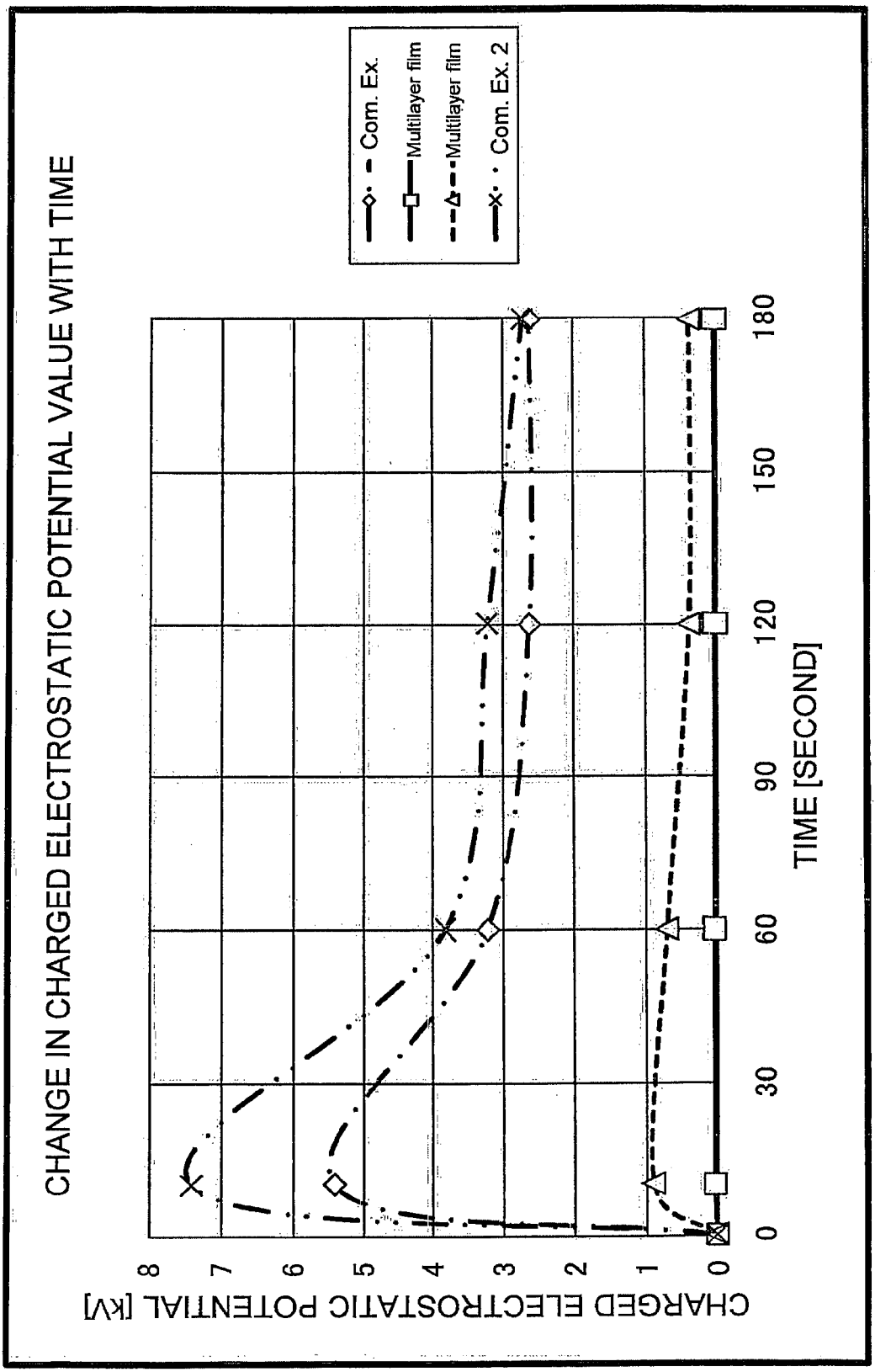
FIG. 10B is a graph relating to FIG. 10A.

In order to evaluate the anti-static properties, as with the single layer film, the measurement of charged electrostatic potential and the steel wool adhesion test were performed. The results are shown in the table in FIG. 10A, and the graph of the measurement of charged electrostatic potential is shown in FIG. 10B. The results are shown that the multilayer films 1 and 2 have higher anti-static properties than those of Comparative Examples 1 and 2

FIG. 11 shows a table relating to various test results for evaluating other properties.

The column "coloring" shows the results of the lens coloring evaluated from the appearance observation similar to that for the single layer film. The coloring was not observed in Comparative Examples 1 and 2 and the multilayer films 1 and 2.

Next, the column "after xenon irradiation for 120 hours" shows the evaluation of the appearance degradation after the irradiation with a xenon lamp for applying ultraviolet rays for 120 hours. Also in this case, the coloring was not observed in Comparative Examples 1 and 2 and the multilayer films 1 and 2.

Then, the column "alkaline artificial sweat" shows the change after the immersion in an alkaline artificial sweat for 24 hours. Here, the alkaline artificial sweat is prepared by placing 10 grams (g) of sodium chloride, 2.5 g of sodium hydrogen phosphate dodecahydrate, and 4.0 g of ammonium carbonate in a beaker and dissolving them in 1 liter of pure water. Into the alkaline artificial sweat, a lens was immersed, and stood in an environment at 20 degrees Celsius for 24 hours. After the standing for 24 hours, the lens was taken out, washed with water, and subjected to the appearance test. As a result, in Comparative Examples 1 and 2 and the multilayer films 1 and 2, each appearance was not changed after the immersion in the alkaline artificial sweat for a long time.

A sufficient amount of tap water for the lens immersion was boiled in a beaker, and a lens was immersed and boiled in the boiled tap water for 10 minutes. The results of the appearance change after boiling are shown in the column "tap water boiling test". As a result, in Comparative Examples 1 and 2 and the multilayer films 1 and 2, each of the formed anti-reflective coatings was not peeled even after the immersion and boiling for 10 minutes, and favorable results are obtained.

The column "constant temperature and humidity test (7 days)" shows the results of a constant temperature and humidity test that evaluates the change of a lens that is stood in an environment at 60 degrees Celsius and 95% for 7 days. As a result, in Comparative Examples 1 and 2 and the multilayer films 1 and 2, no change was revealed by the constant temperature and humidity test.

Figure 12B:
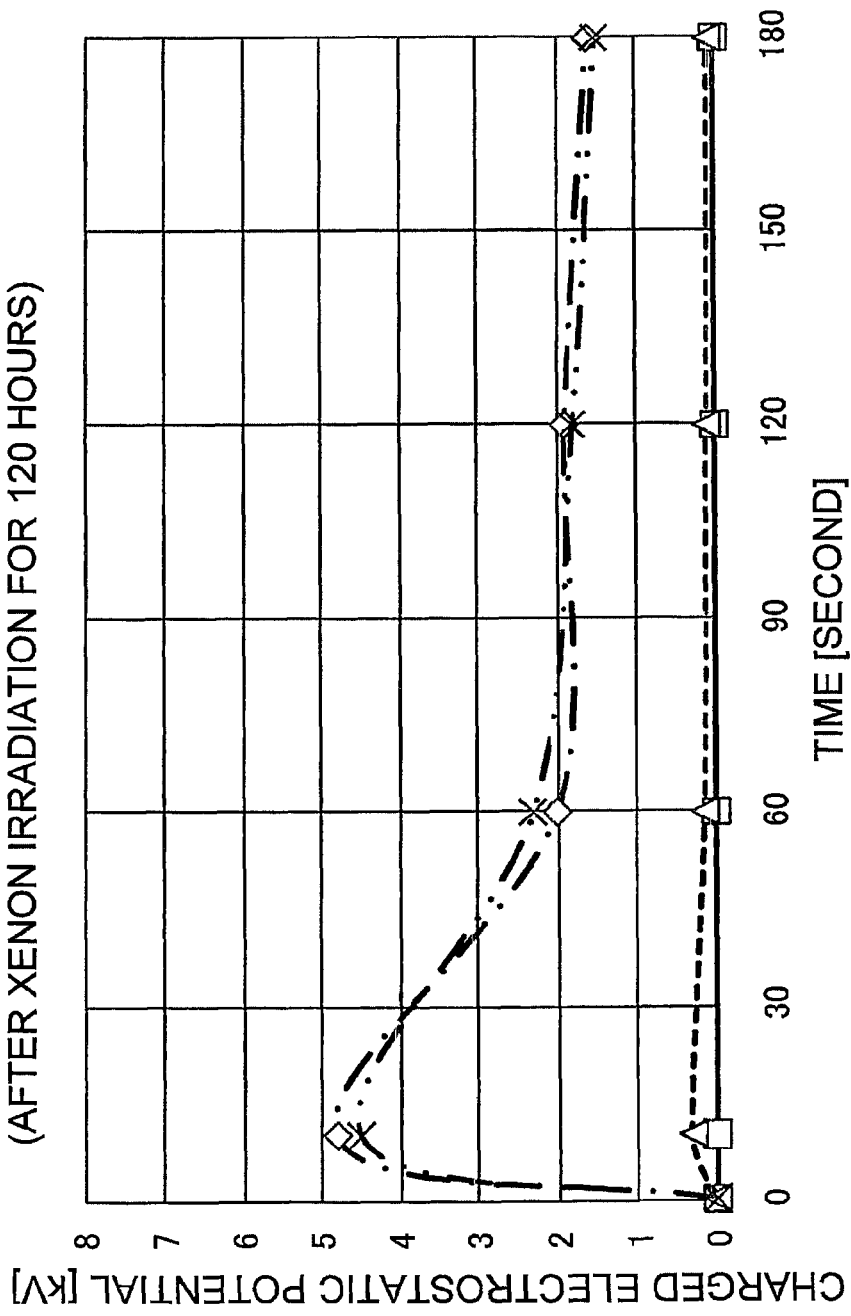
FIG. 12B is a graph relating to FIG. 12A.

The lenses after the xenon lamp irradiation test were further subjected to the static electrification test similar to that for the single layer film. The results are shown in the table in FIG. 12A and in the graph in FIG. 12B. The results reveal that Comparative Examples 1 and 2 have poor anti-static properties while the multilayer films 1 and 2 maintain the anti-static properties even after irradiation with strong ultraviolet rays for a long time, and the anti-static properties have the ultraviolet ray resistance.

Figure 13B:
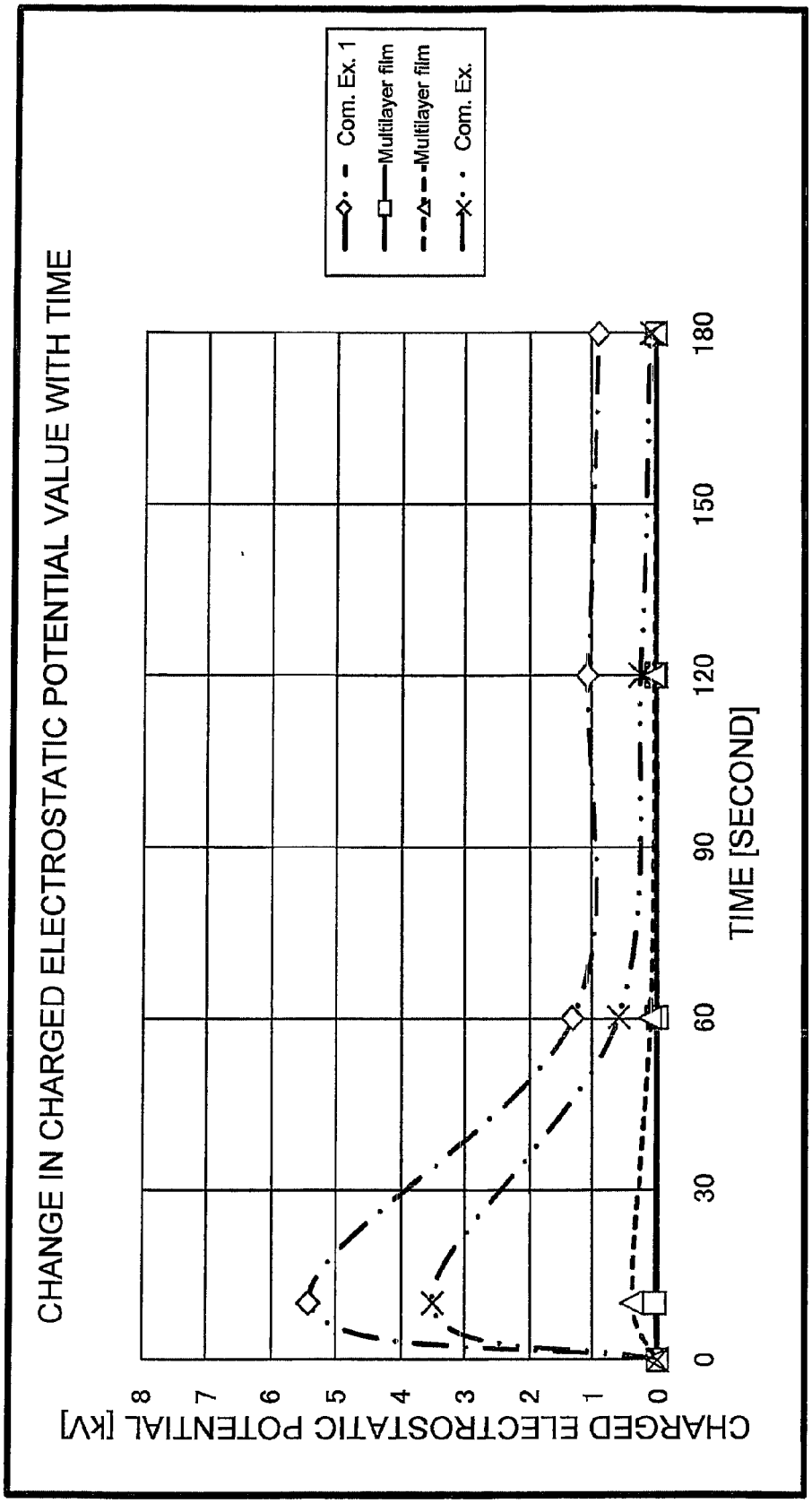
FIG. 13B is a graph relating to FIG. 13A.

Furthermore, the lenses after the constant temperature and humidity test were subjected to the static electrification test similar to that for the single layer film. The results are shown in the table in FIG. 13A and in the graph in FIG. 13B. The results reveal that Comparative Examples 1 and 2 have no anti-static properties while the multilayer films 1 and 2 maintain the anti-static properties even after the exposure to a high temperature and high humidity environment, for example, in a low-temperature sauna, for a long time, and the anti-static properties have durability.

From the results shown above, even in the multilayer film, the TiOx layer formed at a film forming pressure of $5.0 \times 10^{-3}$ Pa and having an optical film thickness of $0.173\lambda$ can satisfy both the high transmission properties and the high anti-static properties even when the TiOx layer is placed in any position. Moreover, in a similar manner, the tests on lenses formed at other film forming pressures reveal that the arrangement of one TiOx layer that meets conditions similar to those for the single layer film described above can satisfy both the high transmission properties and the high anti-static properties. Furthermore, it is revealed that the anti-static properties have excellent durability with respect to ultraviolet rays and a high temperature and humidity environment. The arrangement of one TiOx layer can achieve the anti-static properties without impairing the transmission properties, but two or more TiOx layers meeting the above conditions may also be arranged. In other multi-layered structure such as a five layered structure, one or more TiOx layers meeting the conditions may also be arranged.

The invention claimed is:

1. An optical member, comprising
a substoichiometric titanium oxide film formed by depositing a substoichiometric titanium oxide in a vacuum chamber into which an oxygen gas for adjusting a vacuum is introduced, wherein
a film forming pressure p (Pa) in the vacuum chamber and an optical film thickness (a refractive index of 2.50, a wavelength of 500 nm) of the substoichiometric titanium oxide film have relations:

$$0.0067 \geq p \geq 0.005, \quad (1)$$

$$\text{optical film thickness} \leq 0.450\lambda, \text{ and} \quad (2)$$

$$\text{optical film thickness} \geq (0.001\exp(905.73p) - 0.050)\lambda \quad (3)$$

where exp is an exponential function with e as a base of natural logarithm.

2. The optical member according to claim 1, wherein a relation (3-1) is employed in place of the relation (3):

$$\text{optical film thickness} \geq (0.001\exp(905.73p))\lambda \quad (3\text{-}1)$$

where exp is an exponential function with e as a base of natural logarithm.

3. The optical member according to claim 1, wherein the substoichiometric titanium oxide film is formed by depositing while being assisted by at least an oxygen ion or an argon ion or while being treated with plasma.

4. The optical member according to claim 1, wherein the substoichiometric titanium oxide film is a high refractive index layer in an anti-reflective coating containing a low refractive index layer and the high refractive index layer.

5. A plastic lens for eyeglasses, wherein the optical member as claimed in claim 1 is used.

6. The plastic lens for eyeglasses according to claim 5, further comprising a hard coat layer.

7. A method for manufacturing an optical member, comprising
depositing a substoichiometric titanium oxide in a vacuum chamber into which an oxygen gas for adjusting a vacuum is introduced to form a substoichiometric titanium oxide film on a substrate, wherein
a film forming pressure p (Pa) in the vacuum chamber and an optical film thickness (a refractive index of 2.50, a wavelength of 500 nm) of the substoichiometric titanium oxide film have relations:

$$0.0067 \geq p \geq 0.005, \quad (1)$$

$$\text{optical film thickness} \leq 0.450\lambda, \text{ and} \quad (2)$$

$$\text{optical film thickness} \geq (0.001\exp(905.73p) - 0.050)\lambda \quad (3)$$

where exp is an exponential function with e as a base of natural logarithm.

8. The method for manufacturing an optical member according to claim 7, wherein a relation (3-1) is employed in place of the relation (3):

$$\text{optical film thickness} \geq (0.001\exp(905.73p))\lambda \quad (3\text{-}1)$$

where exp is an exponential function with e as a base of natural logarithm.

9. The method for manufacturing an optical member according to claim 7, wherein
the deposition is carried out while being assisted by an oxygen ion and/or an argon ion or while being treated with plasma.

10. The method for manufacturing an optical member according to claim 7, wherein
the substoichiometric titanium oxide film is formed as a high refractive index layer in an anti-reflective coating containing a low refractive index layer and the high refractive index layer.

11. A method for manufacturing a plastic lens for eyeglasses, comprising
manufacturing a plastic lens for eyeglasses by using the manufacturing method as claimed in claim 7.

12. The method for manufacturing a plastic lens for eyeglasses according to claim 11, wherein
a hard coat layer is formed prior to the formation of the substoichiometric titanium oxide film.

* * * * *